United States Patent
Koya et al.

(10) Patent No.: US 11,476,807 B2
(45) Date of Patent: Oct. 18, 2022

(54) POWER AMPLIFIER MODULE

(71) Applicant: Murata Manufacturing Co., Ltd., Kyoto (JP)

(72) Inventors: Shigeki Koya, Kyoto (JP); Takayuki Tsutsui, Kyoto (JP); Yasunari Umemoto, Kyoto (JP); Isao Obu, Kyoto (JP); Satoshi Tanaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 45 days.

(21) Appl. No.: 17/082,990

(22) Filed: Oct. 28, 2020

(65) Prior Publication Data

US 2021/0044256 A1    Feb. 11, 2021

Related U.S. Application Data

(63) Continuation of application No. 16/190,861, filed on Nov. 14, 2018, now Pat. No. 10,855,232.

(30) Foreign Application Priority Data

Nov. 17, 2017 (JP) .............................. JP2017-221424

(51) Int. Cl.
   *H03F 1/32*    (2006.01)
   *H03F 3/21*    (2006.01)
   (Continued)

(52) U.S. Cl.
   CPC ............ *H03F 1/32* (2013.01); *H03F 1/0216* (2013.01); *H03F 1/565* (2013.01); *H03F 3/19* (2013.01); *H03F 3/21* (2013.01); *H03F 3/245* (2013.01); *H03G 3/004* (2013.01); *H03G 3/3042* (2013.01); *H03F 2200/222* (2013.01);
   (Continued)

(58) Field of Classification Search
   CPC ........................................................ H03F 1/32
   See application file for complete search history.

(56) References Cited

U.S. PATENT DOCUMENTS 5,561,395 A    10/1996    Melton et al.
5,886,575 A    3/1999     Long
(Continued)

FOREIGN PATENT DOCUMENTS

JP    200981692       4/2009
WO    2009/004733 A1  1/2009

*Primary Examiner* — Patricia T Nguyen
(74) *Attorney, Agent, or Firm* — Pearne & Gordon LLP

(57) ABSTRACT

A power amplifier module includes a first amplifier circuit that amplifies a radio frequency signal with a first gain corresponding to a first control signal to generate a first amplified signal; a second amplifier circuit that amplifies the first amplified signal with a second gain corresponding to a second control signal to generate a second amplified signal; and a control unit that generates the first control signal and the second control signal. The second control signal is a control signal for increasing a power-supply voltage for the second amplifier circuit as a peak-to-average power ratio of the radio frequency signal increases. The first control signal is a control signal for controlling the first gain of the first amplifier circuit so that a variation in the second gain involved in a variation in the power-supply voltage for the second amplifier circuit is compensated for.

10 Claims, 5 Drawing Sheets

(51) Int. Cl.
  *H03F 3/19*   (2006.01)
  *H03G 3/00*   (2006.01)
  *H03F 1/56*   (2006.01)
  *H03F 1/02*   (2006.01)
  *H03G 3/30*   (2006.01)
  *H03F 3/24*   (2006.01)

(52) U.S. Cl.
  CPC .. *H03F 2200/318* (2013.01); *H03F 2200/387* (2013.01); *H03F 2200/451* (2013.01)

(56) References Cited

U.S. PATENT DOCUMENTS

| | | | |
|---|---|---|---|
| 6,215,987 B1* | 4/2001 | Fujita | H03G 3/3042 330/51 |
| 2006/0139089 A1 | 6/2006 | Bambridge et al. | |
| 2006/0232338 A1* | 10/2006 | Park | H03F 1/32 330/280 |
| 2007/0279130 A1 | 12/2007 | Furuta | |
| 2009/0039960 A1* | 2/2009 | Park | H03G 3/3042 330/133 |
| 2009/0085664 A1 | 4/2009 | Yang et al. | |
| 2010/0026393 A1 | 2/2010 | Keerti et al. | |
| 2010/0184393 A1 | 7/2010 | Tougou | |
| 2014/0184334 A1 | 7/2014 | Nobbe et al. | |
| 2014/0266460 A1* | 9/2014 | Nobbe | H03F 3/72 330/295 |
| 2014/0354350 A1* | 12/2014 | Bowers | H03F 1/301 327/564 |
| 2015/0311874 A1* | 10/2015 | Samelis | H03F 3/195 455/114.1 |

* cited by examiner

POWER AMPLIFIER MODULE

CROSS REFERENCE TO RELATED APPLICATIONS

This is a Continuation of U.S. patent application Ser. No. 16/190,861 filed on Nov. 14, 2018, which claims priority from Japanese Patent Application No. 2017-221424 filed on Nov. 17, 2017. The contents of these applications are incorporated herein by reference in their entireties.

BACKGROUND OF THE DISCLOSURE

Field of the Disclosure

The present disclosure relates to a power amplifier module.

Description of the Related Art

In recent years, in wireless communication systems, techniques such as multi-level modulation and multi-carrier transmission are used, thereby increasing transmission capacity. In multi-level modulation, multi-carrier transmission, and so forth, a plurality of signal waveforms are combined, thereby increasing a peak-to-average power ratio (PAPR). In a power amplifier that amplifies a signal with such a high PAPR, a backoff operation is typically performed in which amplification is performed with an output being lower than a maximum output to achieve linearity. On the other hand, in the case where a signal with a low PAPR is amplified, linearity is maintained even when the backoff of the power amplifier is small, thus enabling the power amplifier to operate in a mode in which efficiency is emphasized.

For example, Japanese Unexamined Patent Application Publication No. 2009-81692 discloses a wireless communication apparatus including two amplification paths with different power consumption configured to amplify a modulated signal; and a control unit configured to perform control so that an amplification path selected in accordance with the number of subcarriers included in the modulated signal amplifies the modulated signal. With respect to a signal with a large number of subcarriers, that is, a signal with a high PAPR, the wireless communication apparatus performs amplification using an amplification path having low efficiency and a large backoff. With respect to a signal with a small number of subcarriers, that is, a signal with a low PAPR, the wireless communication apparatus performs amplification using an amplification path having high efficiency and a small backoff.

However, in a configuration in which a plurality of amplification paths are switched, gain differs according to an amplification path, thus causing variations in gain. Furthermore, a plurality of amplification paths are necessary, thereby making it impossible to reduce the size of a module. Additionally, switching loss due to switching between amplification paths occurs.

BRIEF SUMMARY OF THE DISCLOSURE

The present disclosure has been made in consideration of such circumstances to provide a power amplifier module that enables improvements in linearity and efficiency with a simple configuration.

A power amplifier module according to one preferred embodiment of the present disclosure includes a first amplifier circuit configured to amplify a radio frequency signal with a first gain corresponding to a first control signal to generate a first amplified signal; a second amplifier circuit configured to amplify the first amplified signal with a second gain corresponding to a second control signal to generate a second amplified signal; and a control unit configured to generate the first control signal and the second control signal. The second control signal is a control signal for increasing a power-supply voltage for the second amplifier circuit as a peak-to-average power ratio of the radio frequency signal increases. The first control signal is a control signal for controlling the first gain of the first amplifier circuit so that a variation in the second gain involved in a variation in the power-supply voltage for the second amplifier circuit is compensated for.

Preferred embodiments of the present disclosure may provide a power amplifier module that enables improvements in linearity and efficiency with a simple configuration.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

Figure 1:
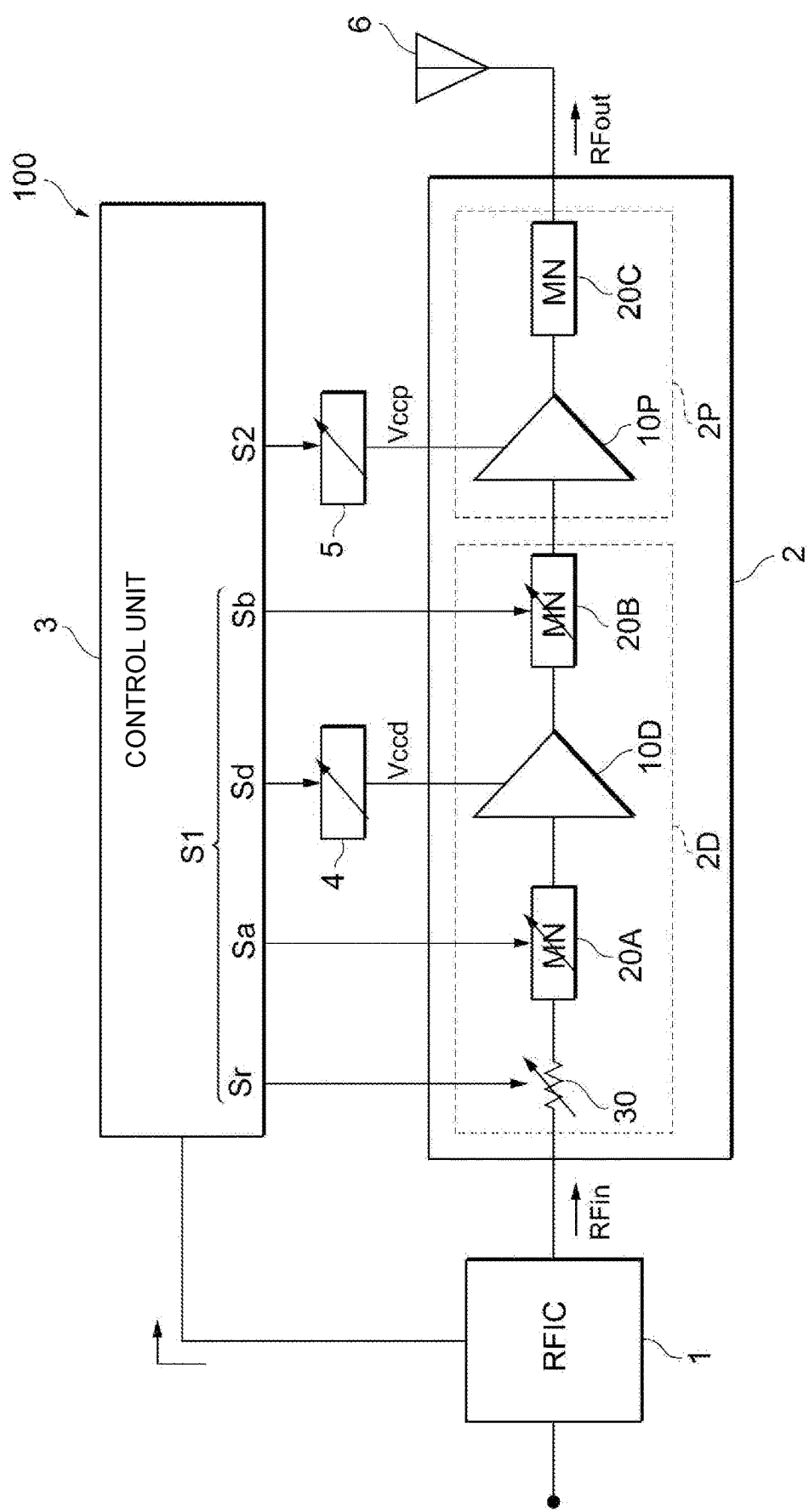
FIG. 1 is a circuit diagram of a radio frequency (RF) signal processing module according to a first embodiment of the present disclosure.

Preferred embodiments of the present disclosure will be described with reference to the accompanying drawings. In figures, elements denoted by the same reference numerals have the same or similar configuration.

First Embodiment (1) Configuration of RF Signal Processing Module 100

FIG. 1 is a circuit diagram of a radio frequency (RF) signal processing module 100 according to a first embodiment of the present disclosure. The RF signal processing module 100 includes a radio frequency integrated circuit (RFIC) 1, a power amplifier module 2, a control unit 3 (e.g., a control circuit such as a controller, microprocessor, integrated circuit, or the like), a power supply circuit 4, and a power supply circuit 5.

(1-1) RFIC 1

The RFIC 1 is a radio frequency integrated circuit, and modulates a signal supplied from a baseband processing unit or the like, which is not illustrated, into a high-frequency signal to generate a radio frequency (RF) signal. The frequency of an RF signal ranges from about several hundred MHz to several GHz, for example.

(1-2) Power Amplifier Module 2

The power amplifier module 2 is a circuit that amplifies an RF signal generated by the RFIC 1. As illustrated in FIG. 1, the power amplifier module 2 includes a drive-stage amplifier circuit 2D (the first amplifier circuit) constituting a first-stage amplifier circuit, and a power-stage amplifier circuit 2P (the second amplifier circuit) constituting a subsequent-stage amplifier circuit.

(1-2-1) Drive-Stage Amplifier Circuit 2D

As illustrated in FIG. 1, the drive-stage amplifier circuit 2D includes, for example, a drive-stage amplifier 10D, a variable attenuator 30, a matching network 20A, and a matching network 20B.

The drive-stage amplifier 10D receives a power-supply voltage Vccd supplied by the power supply circuit 4 and amplifies the RF signal inputted from the RFIC 1 through the variable attenuator 30, the matching network 20A, and so forth to generate a first amplified signal. The drive-stage amplifier 10D may be, for example, a bipolar transistor such as a heterojunction bipolar transistor (HBT), or may be a field-effect transistor such as a metal-oxide-semiconductor field-effect transistor (MOSFET). The drive-stage amplifier 10D may be constituted by a plurality of power amplifiers. The power-supply voltage Vccd supplied by the power supply circuit 4 to the drive-stage amplifier 10D varies according to a control signal Sd from the control unit 3 which is described below.

The variable attenuator 30 is provided between the RFIC 1 and the matching network 20A. The variable attenuator 30 includes, for example, a plurality of attenuators and a plurality of line switches, and attenuates the power of an input signal. A power attenuation factor corresponding to the power ratio between an input signal and an output signal of the variable attenuator 30 varies according to a control signal Sr from the control unit 3 which is described below.

The matching network 20A is provided between the variable attenuator 30 and the drive-stage amplifier 10D and matches the impedance of the variable attenuator 30 to that of the drive-stage amplifier 10D. The matching network 20A is constituted by, for example, a low pass or high pass filter circuit having variable impedance. The impedance of the matching network 20A varies according to a control signal Sa from the control unit 3 which is described below. Here, the RF signal processing module 100 may have a configuration in which the variable attenuator 30 and the matching network 20A are interchanged.

The matching network 20B is provided between the drive-stage amplifier 10D and a power-stage amplifier 10P and matches the impedance of the drive-stage amplifier 10D to that of the power-stage amplifier 10P. The matching network 20B is constituted by, for example, a low pass, high pass, or combination low pass-high pass filter circuit having variable impedance. The impedance of the matching network 20B varies according to a control signal Sb from the control unit 3 which is described below.

The gain (the first gain) of the drive-stage amplifier circuit 2D varies according to the power supply circuit 4 or a component of the drive-stage amplifier circuit 2D. That is, as the power-supply voltage Vccd supplied by the power supply circuit 4 increases, the gain of the drive-stage amplifier 10D increases, and the gain of the drive-stage amplifier circuit 2D therefore increases. As the power attenuation factor of the variable attenuator 30 increases, the magnitude of an input signal to the drive-stage amplifier 10D decreases, and the gain of the drive-stage amplifier circuit 2D therefore decreases. As the impedance of the matching network 20A increases, the magnitude of a reflected wave at an input end of the matching network 20A increases, and the gain of the drive-stage amplifier circuit 2D therefore decreases. Furthermore, as the impedance of the matching network 20B increases, the gain of the drive-stage amplifier 10D increases, and the gain of the drive-stage amplifier circuit 2D therefore increases.

(1-2-2) Power-Stage Amplifier Circuit 2P

As illustrated in FIG. 1, the power-stage amplifier circuit 2P includes, for example, the power-stage amplifier 10P, and a matching network 20C.

The power-stage amplifier 10P receives a power-supply voltage Vccp supplied by the power supply circuit 5 and amplifies the first amplified signal inputted from the drive-stage amplifier 10D through the matching network 20B and so forth to generate a second amplified signal. The power-stage amplifier 10P may be, for example, a bipolar transistor such as an HBT, or may be a field-effect transistor such as a MOSFET. The power-supply voltage Vccp supplied by the power supply circuit 5 to the power-stage amplifier 10P varies according to a second control signal S2 from the control unit 3 which is described below.

Figure 2:
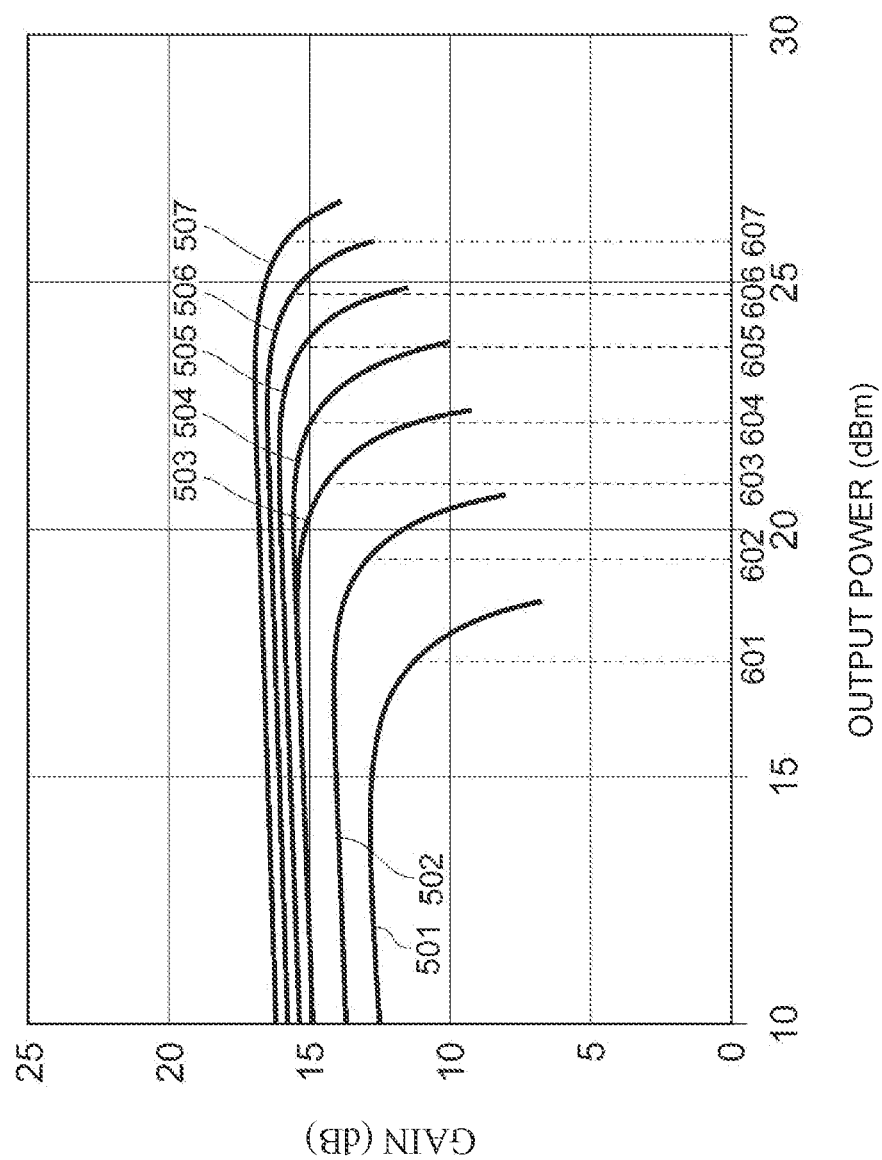
FIG. 2 illustrates changes in gain and linearity of a power-stage amplifier as a function of a change in power-supply voltage.

Here, changes in gain and linearity of the power-stage amplifier 10P as a function of a change in the power-supply voltage Vccp will be described with reference to FIG. 2. FIG. 2 illustrates relationships between the output and gain of the power-stage amplifier 10P with respect to a plurality of values of the power-supply voltage Vccp. That is, reference numerals 501, 502, 503, 504, 505, 506, and 507 respectively represent graphs representing relationships between the output and gain of the power-stage amplifier 10P at power-supply voltages Vccp of about 2.0 V, about 2.5 V, about 3.0 V, about 3.5 V, about 4.0 V, about 4.5 V, and about 5.0 V. Furthermore, reference numerals 601, 602, 603, 604, 605, 606, and 607 respectively represent P1 dB values of the power-stage amplifier 10P at power-supply voltages Vccp of about 2.0 V, about 2.5 V, about 3.0 V, about 3.5 V, about 4.0 V, about 4.5 V, and about 5.0 V. Here, P1 dB refers to an output at a point at which the gain decreases by 1 dB with respect to an ideal linear characteristic. As illustrated in FIG. 2, it may be said that, as the power-supply voltage Vccp increases, the gain of the power-stage amplifier 10P increases. Furthermore, as illustrated in FIG. 2, it may be said that, as the power-supply voltage Vccp increases, the P1 dB of the power-stage amplifier 10P increases, and the linearity improves.

The gain (the second gain) of the power-stage amplifier circuit 2P varies according to the power supply circuit 5. That is, as the power-supply voltage Vccp supplied by the power supply circuit 5 increases, the gain of the power-stage amplifier 10P increases, and the gain of the power-stage amplifier circuit 2P therefore increases, too.

The matching network 20C is provided between the power-stage amplifier 10P and an antenna 6 and matches the impedance of the power-stage amplifier 10P to that of the antenna 6. The matching network 20C (impedance matching network) is constituted by, for example, a low pass or high pass filter circuit, or a combination low pass-high pass filter circuit.

(1-3) Control Unit 3

The control unit 3 is connected to the RFIC 1 and the power amplifier module 2. The control unit 3 detects a predetermined signal generated by the RFIC 1 and generates a first control signal S1 for controlling the drive-stage amplifier circuit 2D, and the second control signal S2 for controlling the power-stage amplifier circuit 2P.

The first control signal S1 is a control signal for controlling the gain of the drive-stage amplifier circuit 2D so that a variation in the gain of the power-stage amplifier circuit 2P involved in a variation in the power-supply voltage Vccp supplied by the power supply circuit 5 is compensated for. The first control signal S1 includes, for example, at least any of the control signal Sr for controlling the variable attenuator 30, the control signal Sa for controlling the matching network 20A, the control signal Sd for controlling the power supply circuit 4, and the control signal Sb for controlling the matching network 20B.

The second control signal S2 is a control signal for increasing the power-supply voltage Vccp for the power-stage amplifier circuit 2P as a peak-to-average power ratio (PAPR) of the RF signal generated by the RFIC 1 increases. The second control signal S2 is a control signal for controlling the power supply circuit 5.

(2) Operation of RF Signal Processing Module 100

Next, the operation of the RF signal processing module 100 will be described.

(2-1) Operation of Power-Stage Amplifier Circuit 2P

The control unit 3 detects a signal having information about a PAPR of an RF signal generated by the RFIC 1, calculates the PAPR of the RF signal, and then generates the second control signal S2 for increasing the power-supply voltage Vccp for the power-stage amplifier 10P supplied by the power supply circuit 5 as the calculated PAPR increases. As described above with reference to FIG. 2, as the power-supply voltage Vccp increases, the P1 dB of the power-stage amplifier 10P increases (the linearity improves), and the gain of the power-stage amplifier circuit 2P also increases. Hence, as the PAPR of the RF signal generated by the RFIC 1 increases, the P1 dB of the power-stage amplifier 10P increases (the linearity improves), and the gain of the power-stage amplifier circuit 2P also increases.

(2-2) Operation of Drive-Stage Amplifier Circuit 2D

The control unit 3 generates the first control signal S1 for controlling the gain of the drive-stage amplifier circuit 2D so that a variation in the gain of the power-stage amplifier circuit 2P involved in a variation in the power-supply voltage Vccp supplied by the power supply circuit 5 is compensated for.

Specifically, for example, when the gain of the power-stage amplifier circuit 2P increases, the control unit 3 controls a line switch of the variable attenuator 30 by using the control signal Sr to increase the power attenuation factor of the variable attenuator 30, thereby reducing the gain of the drive-stage amplifier circuit 2D. For example, when the gain of the power-stage amplifier circuit 2P increases, the control unit 3 increases the impedance of the matching network 20A by using the control signal Sa to increase the magnitude of a reflected wave at the input end of the matching network 20A, thereby reducing the gain of the drive-stage amplifier circuit 2D. For example, when the gain of the power-stage amplifier circuit 2P increases, the control unit 3 reduces the power-supply voltage Vccd supplied by the power supply circuit 4 by using the control signal Sd, thereby reducing the gain of the drive-stage amplifier circuit 2D. Furthermore, for example, when the gain of the power-stage amplifier circuit 2P increases, the control unit 3 reduces the impedance of the matching network 20B by using the control signal Sb, thereby reducing the gain of the drive-stage amplifier circuit 2D.

Similarly, when the gain of the power-stage amplifier circuit 2P decreases, the control unit 3 controls a line switch of the variable attenuator 30 by using the control signal Sr to reduce the power attenuation factor of the variable attenuator 30, thereby increasing the gain of the drive-stage amplifier circuit 2D. For example, when the gain of the power-stage amplifier circuit 2P decreases, the control unit 3 reduces the impedance of the matching network 20A by using the control signal Sa to reduce the magnitude of a reflected wave at the input end of the matching network 20A, thereby increasing the gain of the drive-stage amplifier circuit 2D. For example, when the gain of the power-stage amplifier circuit 2P decreases, the control unit 3 increases the power-supply voltage Vccd supplied by the power supply circuit 4 by using the control signal Sd, thereby increasing the gain of the drive-stage amplifier circuit 2D. Furthermore, for example, when the gain of the power-stage amplifier circuit 2P decreases, the control unit 3 increases the impedance of the matching network 20B by using the control signal Sb, thereby increasing the gain of the drive-stage amplifier circuit 2D.

Second Embodiment

Figure 3:
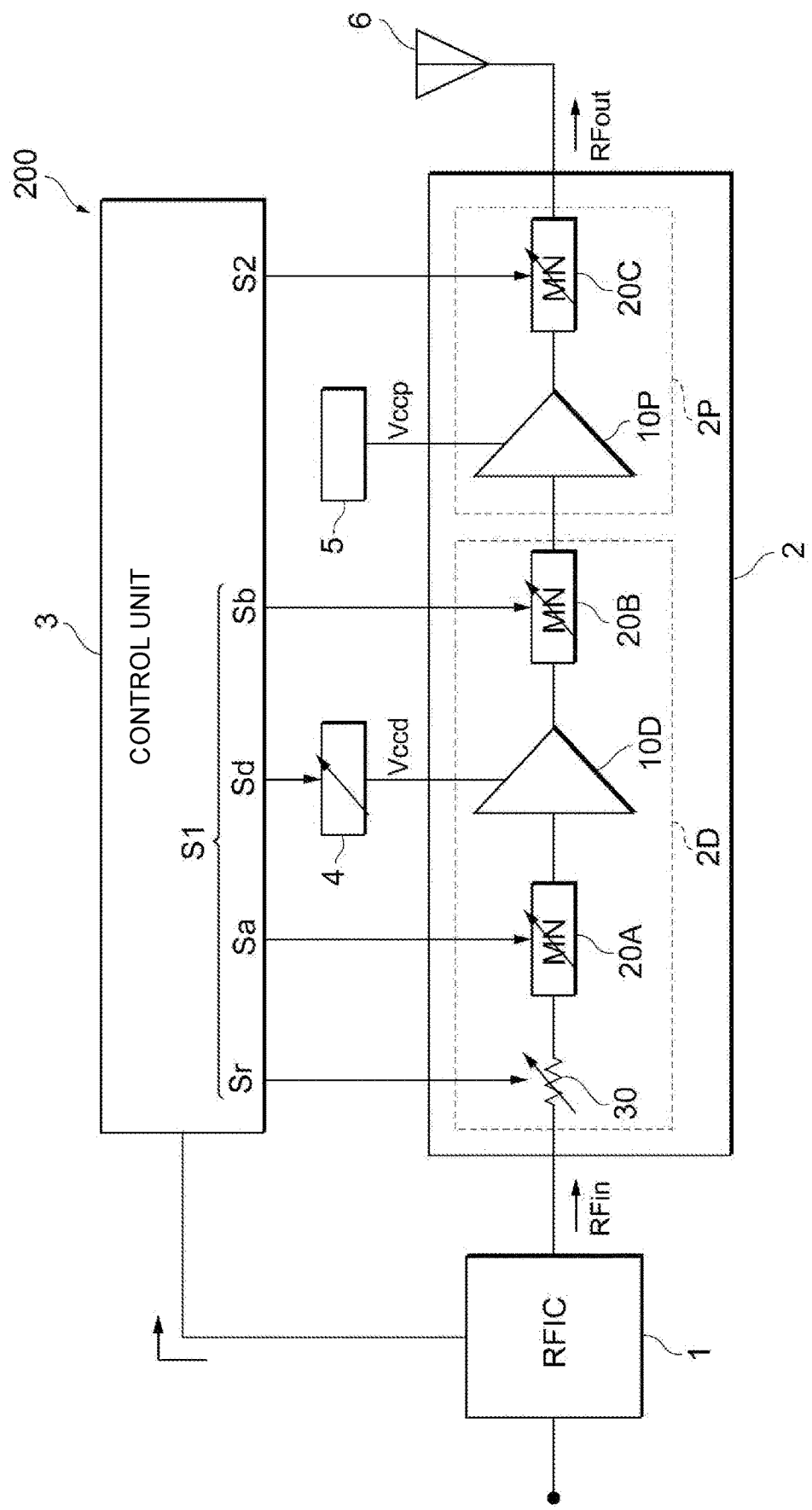
FIG. 3 is a circuit diagram of an RF signal processing module according to a second embodiment of the present disclosure.

FIG. 3 is a circuit diagram of an RF signal processing module 200 according to a second embodiment of the present disclosure. Hereinafter, among elements of the RF signal processing module 200, elements that differ from those of the RF signal processing module 100 according to the first embodiment of the present disclosure will be described, and the description of elements that are the same as those of the RF signal processing module 100 is appropriately omitted.

(1) Configuration of RF Signal Processing Module 200

As described below, the impedance of the matching network 20C included in the RF signal processing module 200 is variable. The control unit 3 included in the RF signal processing module 200 generates, as the second control signal S2, a control signal for controlling the matching network 20C.

Figure 4A:
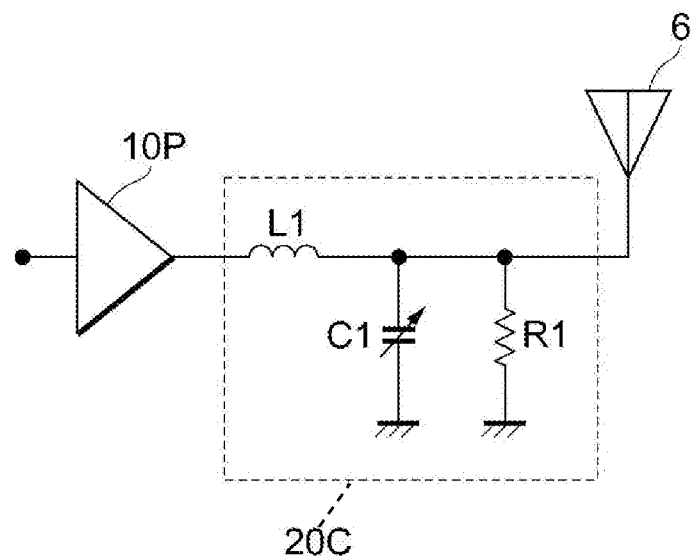
FIG. 4A is a circuit diagram of a low pass filter circuit having variable impedance.

The matching network 20C included in the RF signal processing module 200 is, for example, a low pass filter circuit having variable impedence as illustrated in FIG. 4A. Specifically, the matching network 20C includes, for example, an inductor L1 connected in series between the power-stage amplifier 10P and the antenna 6, and a variable capacitance element C1 and a resistance element R1 that are connected in shunt between the power-stage amplifier 10P and the antenna 6. The variable capacitance element C1 is constituted by, for example, a plurality of capacitance elements and a plurality of line switches. Each line switch is switched between ON and OFF states in accordance with the second control signal S2, and a capacitance value of the variable capacitance element C1 thus changes. Furthermore, the inductor L1 may be configured to have a variable inductance value.

Figure 4B:
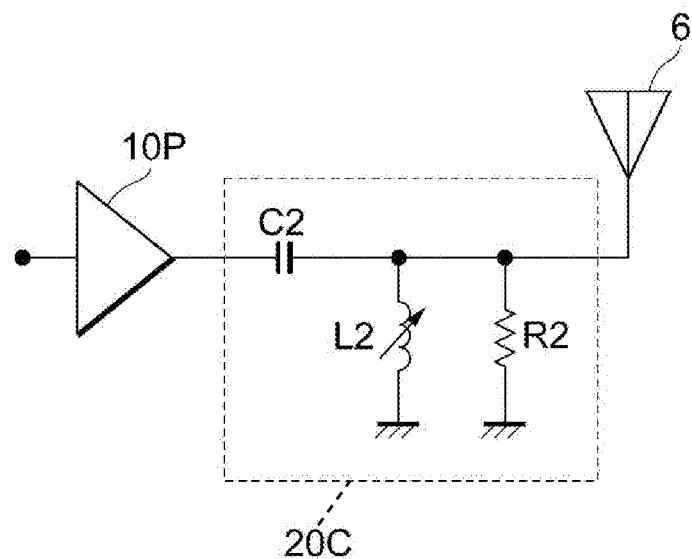
FIG. 4B is a circuit diagram of a high pass filter circuit having variable impedance.

Furthermore, the matching network 20C included in the RF signal processing module 200 is, for example, a high pass filter circuit having variable impedance as illustrated in FIG. 4B. Specifically, the matching network 20C includes, for example, a capacitance element C2 connected in series between the power-stage amplifier 10P and the antenna 6, and a variable inductor L2 and a resistance element R2 that are connected in shunt between the power-stage amplifier 10P and the antenna 6. The variable inductor L2 is constituted by, for example, a plurality of inductors and a plurality of line switches. Each line switch is switched between ON and OFF states in accordance with the second control signal S2, and an inductance value of the variable inductor L2 thus changes. Furthermore, the capacitance element C2 may be configured to have a variable capacitance value.

Figure 5A:
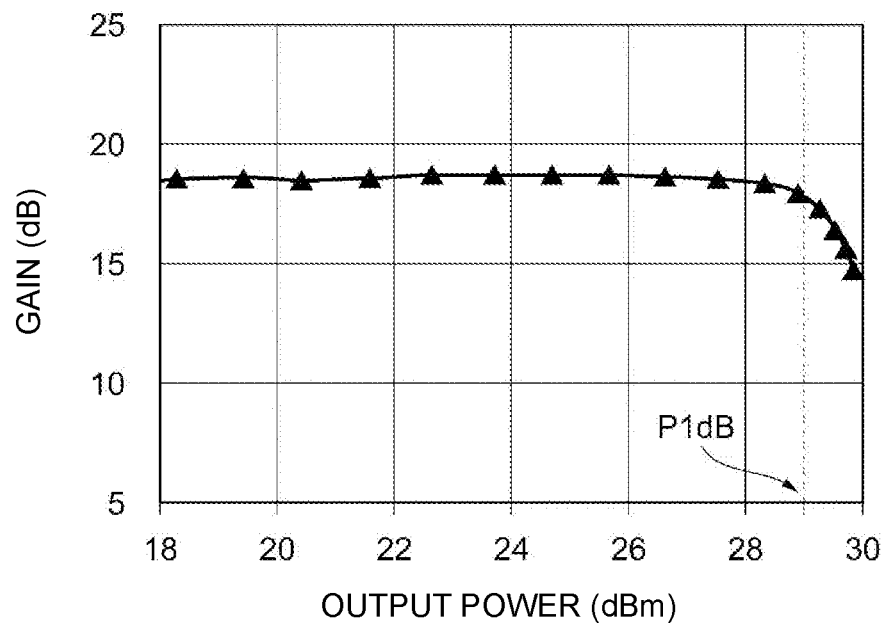
FIG. 5A illustrates changes in gain and linearity of the power-stage amplifier as a function of a change in impedance of a matching network.
Figure 5B:
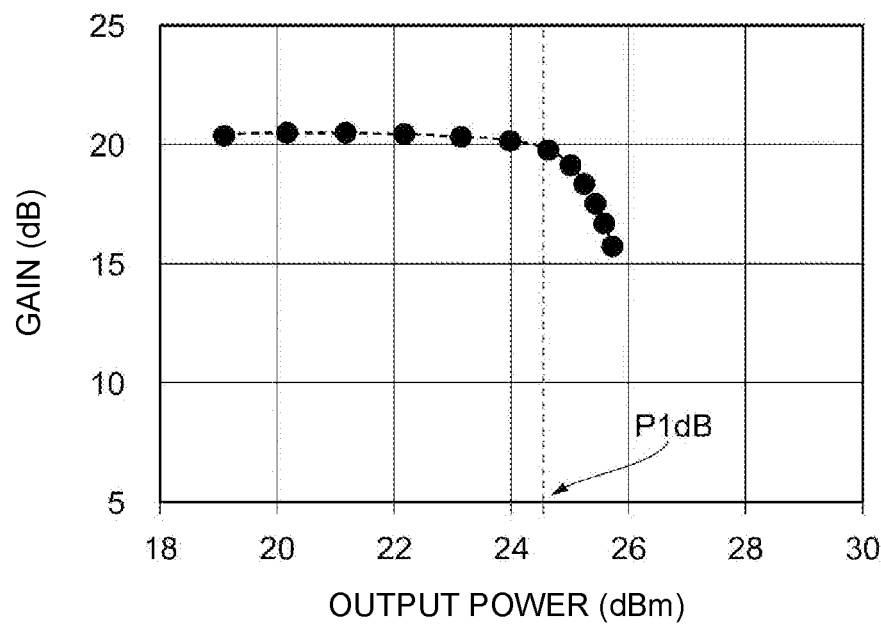
FIG. 5B illustrates changes in gain and linearity of the power-stage amplifier as a function of a change in impedance of the matching network.

Here, changes in gain and linearity of the power-stage amplifier 10P as a function of a change in impedance of the matching network 20C will be described with reference to FIGS. 5A and 5B. FIG. 5A illustrates a relationship between the output and gain of the power-stage amplifier 10P obtained when the impedance of the matching network 20C is about 3Ω. FIG. 5B illustrates a relationship between the output and gain of the power-stage amplifier 10P obtained when the impedance of the matching network 20C is about 8Ω. As illustrated in FIGS. 5A and 5B, it may be said that, as the impedance of the matching network 20C decreases, the gain of the power-stage amplifier 10P decreases. Furthermore, in a graph illustrated in FIG. 5A, P1 dB is about 29 dBm. In a graph illustrated in FIG. 5B, P1 dB is about 24.5 dBm. Hence, in the case illustrated in FIGS. 5A and 5B, it may be said that, as the impedance of the matching network 20C corresponding to a load of the power-stage amplifier 10P decreases, the P1 dB increases, and the linearity improves.

The gain (second gain) of the power-stage amplifier circuit 2P varies according to the impedance of the matching network 20C. In the case illustrated in FIGS. 5A and 5B, as the impedance of the matching network 20C decreases, the gain of the power-stage amplifier 10P decreases, and the gain of the power-stage amplifier circuit 2P therefore decreases, too.

(2) Operation of RF Signal Processing Module 200

The control unit 3 detects a signal having information about a PAPR of an RF signal generated by the RFIC 1, calculates the PAPR of the RF signal, and then generates the second control signal S2 for reducing the impedance of the matching network 20C as the calculated PAPR increases. As described above with reference to FIGS. 5A and 5B, as the impedance of the matching network 20C decreases, the P1 dB of the power-stage amplifier 10P increases (the linearity improves), and the gain of the power-stage amplifier circuit 2P decreases. Hence, as the PAPR of the RF signal generated by the RFIC 1 increases, the P1 dB of the power-stage amplifier 10P increases (the linearity improves), and the gain of the power-stage amplifier circuit 2P decreases in the case illustrated in FIGS. 5A and 5B. Incidentally, in the case where the P1 dB is increased by reducing a load, in contrast with the case illustrated in FIGS. 5A and 5B, the gain of the power-stage amplifier circuit 2P may increase in some cases.

As in the RF signal processing module 100, the control unit 3 generates the first control signal S1 for controlling the gain of the drive-stage amplifier circuit 2D so that a variation in the gain of the power-stage amplifier circuit 2P is compensated for.

The exemplary embodiments of the present disclosure have been described above. The power amplifier module 2 includes the first amplifier circuit 2D configured to amplify an RF signal with a first gain corresponding to a first control signal S1 to generate a first amplified signal; and the second amplifier circuit 2P configured to amplify the first amplified signal with a second gain corresponding to a second control signal S2 to generate a second amplified signal. Hence, the first gain and the second gain are individually controlled, thereby making it possible to flexibly control the gain of the entire power amplifier module 2.

Furthermore, the second control signal S2 is a control signal for increasing a power-supply voltage Vccp for the second amplifier circuit 2P as a PAPR of the RF signal increases, and the first control signal S1 is a control signal for controlling the first gain of the first amplifier circuit 2D so that a variation in the second gain involved in a variation in the power-supply voltage Vccp for the second amplifier circuit 2P is compensated for. Hence, the power amplifier module 2 enables improvements in linearity and efficiency with a simple configuration.

Furthermore, in the power amplifier module 2, the first control signal S1 may be a control signal Sd for controlling a power-supply voltage Vccd for the first amplifier circuit 2D so that a variation in the second gain is compensated for. Hence, in the power amplifier module 2, the power-supply voltage Vccd for the first amplifier circuit 2D is controlled in accordance with a variation in the second gain, the first gain thereby varies so that the variation in the second gain is cancelled out, and the entire gain thus becomes constant.

Furthermore, the power amplifier module 2 may include the variable attenuator 30 configured to attenuate the RF signal, and the first control signal S1 may be a control signal Sr for controlling a power attenuation factor of the variable attenuator 30 so that a variation in the second gain is compensated for. Hence, in the power amplifier module 2, the amount of attenuation of a signal, which is to be inputted to the first amplifier circuit 2D, through the variable attenuator 30 is controlled in accordance with a variation in the second gain, the first gain thereby varies so that the variation in the second gain is cancelled out, and the entire gain thus becomes constant.

Furthermore, the power amplifier module 2 may include the first matching network 20A configured to perform impedance matching between circuits, and the first control signal S1 may be a control signal Sa for controlling impedance of the first matching network 20A so that a variation in the second gain is compensated for. Hence, in the power amplifier module 2, a reflected wave at the input end of the first matching network 20A is controlled in accordance with a variation in the second gain, the first gain thereby varies so that the variation in the second gain is cancelled out, and the entire gain thus becomes constant.

Furthermore, the power amplifier module 2 may include the second matching network 20B configured to perform impedance matching between circuits, and the first control signal S1 may be a control signal Sb for controlling impedance of the second matching network 20B so that a variation in the second gain is compensated for. Hence, in the power amplifier module 2, the first gain of the first amplifier 10D varies so that the variation in the second gain is cancelled out, and the entire gain thus becomes constant.

Furthermore, each of the RF signal processing modules 100 and 200 includes the power amplifier module 2 including the first amplifier circuit 2D configured to amplify an RF signal with a first gain to generate a first amplified signal, and the second amplifier circuit 2P configured to amplify the first amplified signal with a second gain to generate a second amplified signal. Hence, in each of the RF signal processing modules 100 and 200, the first gain and the second gain are individually controlled, thereby making it possible to flexibly control the gain of the entire power amplifier module 2.

Furthermore, each of the RF signal processing modules 100 and 200 further includes the control unit 3 configured to generate a second control signal S2 for increasing a power-supply voltage Vccp for the second amplifier circuit 2P as a PAPR of the RF signal increases, and a first control signal S1 for controlling the first gain of the first amplifier circuit 2D so that a variation in the second gain involved in a variation in the power-supply voltage Vccp for the second amplifier circuit 2P is compensated for. Hence, each of the RF signal processing modules 100 and 200 makes it possible to achieve linearity and efficiency with a simple configuration.

The above-described embodiments are intended to facilitate understanding of the present disclosure, but are not intended for a limited interpretation of the present disclosure. The elements included in the embodiments, and the arrangements, materials, conditions, shapes, sizes, and the like of the elements are not limited to those exemplified in the embodiments, and can be appropriately changed. Furthermore, configurations described in different embodiments can be partially replaced or combined with each other.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplifier module comprising:
a first amplifier circuit configured to amplify a radio frequency signal with a first gain and to generate a first amplified signal, wherein the first gain corresponds to a first control signal;
a second amplifier circuit configured to amplify the first amplified signal with a second gain and to generate a second amplified signal, wherein the second gain corresponds to a second control signal; and
a control circuit configured to generate the first control signal and the second control signal,
wherein the second control signal is configured to cause an adjustment of a power-supply voltage of the second amplifier circuit as a peak-to-average power ratio of the radio frequency signal varies, and
wherein the first control signal is configured to cause an adjustment of the first gain of the first amplifier circuit in a manner that compensates for a variation in the second gain resulting from a variation in the power-supply voltage of the second amplifier circuit.

2. The power amplifier module according to claim 1, wherein the first control signal is configured to cause the adjustment of the first gain by causing an adjustment of a power-supply voltage for the first amplifier circuit.

3. The power amplifier module according to claim 1, wherein the first amplifier circuit comprises a variable attenuator configured to attenuate the radio frequency signal, and
wherein the first control signal is configured to adjust a power attenuation factor of the variable attenuator in a manner that compensates for the variation in the second gain.

4. The power amplifier module according to claim 2, wherein the first amplifier circuit comprises a variable attenuator configured to attenuate the radio frequency signal, and
wherein the first control signal is configured to adjust a power attenuation factor of the variable attenuator in a manner that compensates for the variation in the second gain.

5. The power amplifier module according to claim 1, wherein the first amplifier circuit comprises a matching network configured to perform impedance matching between circuits, and
wherein the first control signal is configured to cause an adjustment in an impedance of the matching network in a manner that compensates for the variation in the second gain.

6. The power amplifier module according to claim 2, wherein the first amplifier circuit comprises a matching network configured to perform impedance matching between circuits, and
wherein the first control signal is configured to cause an adjustment in an impedance of the matching network in a manner that compensates for the variation in the second gain.

7. The power amplifier module according to claim 3, wherein the first amplifier circuit comprises a matching network configured to perform impedance matching between circuits, and
wherein the first control signal is configured to cause an adjustment in an impedance of the matching network in a manner that compensates for the variation in the second gain.

8. A power amplifier module comprising:
a first amplifier circuit configured to amplify a radio frequency signal with a first gain and to generate a first amplified signal, wherein the first gain corresponds to a first control signal;
a second amplifier circuit configured to amplify the first amplified signal with a second gain and to generate a second amplified signal, wherein the second gain corresponds to a second control signal; and
a control circuit configured to generate the first control signal and the second control signal,
wherein the second control signal is configured to cause an increase in a power-supply voltage of the second amplifier circuit as a peak-to-average power ratio of the radio frequency signal increases.

9. The power amplifier module according to claim 8, wherein the second amplifier circuit comprises an output matching network, and
wherein the second gain decreases as an impedance of the output matching network decreases.

10. The power amplifier module according to claim 8, wherein the second amplifier circuit comprises an output matching network, and
wherein the second control signal is configured to cause an adjustment of an impedance of the output matching network by causing an adjustment of a variable reactance element of the output matching network.

* * * * *